United States Patent
Mio et al.

(10) Patent No.: US 8,061,621 B2
(45) Date of Patent: Nov. 22, 2011

(54) INTEGRATED CIRCUIT DEVICE INCLUDING TUNABLE SUBSTRATE CAPACITORS

(75) Inventors: Hannes Mio, Taufkirchen (DE); Thomas Beer, Mauerstetten (DE)

(73) Assignee: Infineon Technologies AG, Neubiberg (DE)

( * ) Notice: Subject to any disclaimer, the term of this patent is extended or adjusted under 35 U.S.C. 154(b) by 828 days.

(21) Appl. No.: 12/044,329

(22) Filed: Mar. 7, 2008

(65) Prior Publication Data
US 2009/0224055 A1 Sep. 10, 2009

(51) Int. Cl.
*G06K 19/06* (2006.01)

(52) U.S. Cl. .......................... 235/492; 235/451

(58) Field of Classification Search .................. 235/492, 235/451; 340/572.5, 572
See application file for complete search history.

(56) References Cited

U.S. PATENT DOCUMENTS

| | | | |
|---|---|---|---|
| 6,268,796 B1 | 7/2001 | Gnadinger et al. | |
| 6,480,110 B2* | 11/2002 | Lee et al. | 340/572.5 |
| 6,522,308 B1* | 2/2003 | Mathieu | 343/895 |
| 7,301,458 B2* | 11/2007 | Carrender et al. | 340/572.1 |
| 7,551,058 B1* | 6/2009 | Johnson et al. | 340/10.41 |
| 2002/0067602 A1* | 6/2002 | Muller | 361/782 |
| 2007/0095926 A1 | 5/2007 | Zhu et al. | |
| 2007/0187804 A1 | 8/2007 | El Rai et al. | |

FOREIGN PATENT DOCUMENTS

WO 2007051571 5/2007

OTHER PUBLICATIONS

Brunnbauer et al., Embedded Wafer Level Ball Grid Array (eWLB), Electronics Packaging Technology Conference, 2006, pp. 1-5.

* cited by examiner

*Primary Examiner* — Ahshik Kim
(74) *Attorney, Agent, or Firm* — Dicke, Billig & Czaja, PLLC

(57) ABSTRACT

An integrated circuit device and method. A substrate having contacts has a plurality of capacitors thereon. A plurality of fusible links selectively connect the plurality of capacitors to one another and selected ones of the capacitors to the contacts. In this manner, for example, the capacitance value can be adjusted to tune an antenna mounted on the substrate during testing of the integrated circuit device.

15 Claims, 2 Drawing Sheets

US 8,061,621 B2

INTEGRATED CIRCUIT DEVICE INCLUDING TUNABLE SUBSTRATE CAPACITORS

BACKGROUND

With certain integrated circuit devices, such as radio frequency (RF) devices, impedance matching to an antenna is required to achieve the desired performance. For instance, a tuning process is required for RF identification devices (RFID) to achieve the desired operating distance. However, due to typical underlying manufacturing processes of semiconductor wafers, a certain variation and consequently a deviation in the RF-output impedance of the device is encountered. To match the antenna impedance, discrete passive components are required. During test processes for such RF devices, different results can be obtained depending on the variance of those discrete components. A further optimization to match the antenna impedance, such as would be required for RFID devices, does not take place during the component manufacturing processes.

With known processes, such RF components typically are not tuned until they are mounted on a printed circuit board (PCB) as part of a larger system. Tuning processes at a system or board level is difficult and expensive. For instance, in systems on PCBs a tunable capacitor (for example, cermet trimmer) is mounted on the PCB for this purpose. Alternatively, when manufacturing devices such as RF-IDs, the wafer manufacturing process is kept in a narrow process window to keep the variations as low as possible. Unfortunately, this also adds complexity and cost to manufacturing processes.

For these and other reasons, there is a need for the present invention.

SUMMARY

An integrated circuit device includes a substrate having contacts with a plurality of capacitors on the substrate. A plurality of fusible links selectively connect the plurality of capacitors to one another and selected ones of the capacitors to the contacts. In this manner, for example, the capacitance value can be adjusted to tune an antenna mounted on the substrate during testing of the integrated circuit device.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
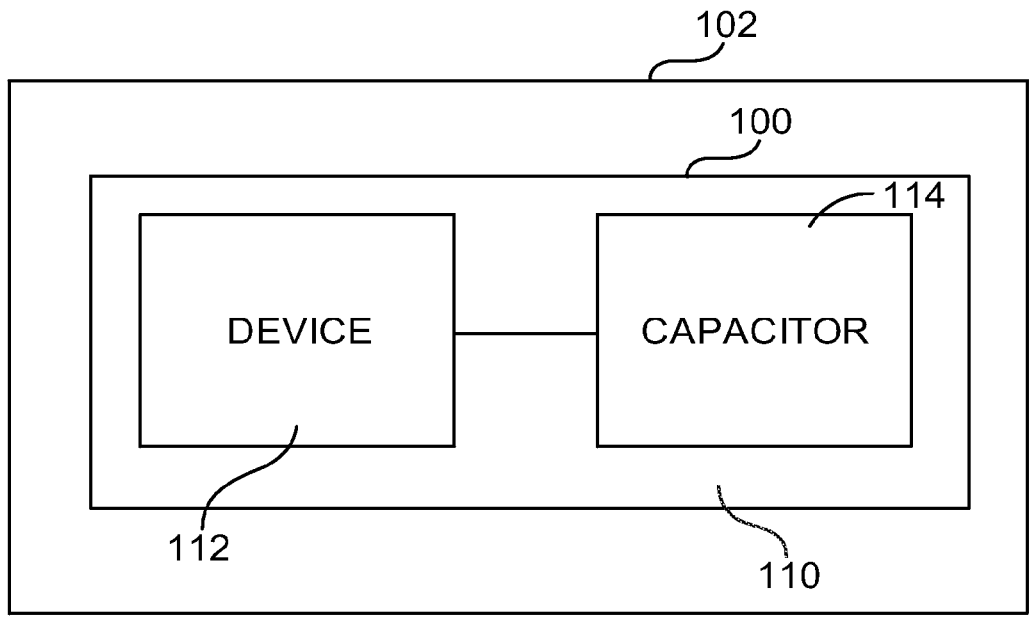
FIG. 1 is a block diagram conceptually illustrates portions of an integrated circuit device system disclosed herein.

FIG. 1 conceptually illustrates portions of an integrated circuit device 100 in accordance with disclosed embodiments. The device 100 includes a substrate 110 with an integrated circuit chip 112 mounted thereon. A variable capacitor 114 is coupled to the integrated circuit chip 112. In certain embodiments, the capacitor 114 is a tunable substrate capacitor that is integrated into a laminate package, allowing immediate antenna matching during a device test process, thereby enabling optimum performance. The integrated circuit device 100 mounted to a printed circuit board (PCB) 102, along with other components as part of an electronic system. The terms coupled, connected, and similar terms and derivatives are used in this disclosure to indicate that two elements co-operate or interact with each other regardless of whether they are in direct physical or electrical contact.

Typically, antenna matching circuitry is required in RF and other types of devices. Reconfigurable capacitors as part of such tunable antenna matching are desirable for several reasons. For instance, fine-tuning of an antenna during manufacturing test procedures before the device is shipped out of the fabrication facility simplifies later assembly of the device into a system.

Figure 2:
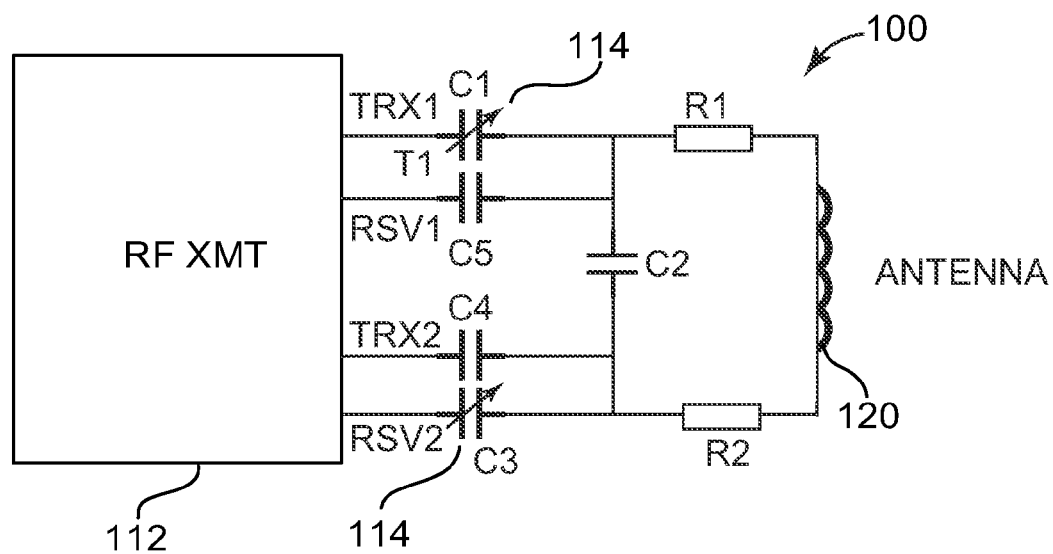
FIG. 2 is a block diagram conceptually illustrating an RF system.

FIG. 2 illustrates an example where the device 100 is an RF device used in an RFID, for example. The device 112 includes RF transmitter circuitry coupled to an antenna 120 that is tunable via a network of configurable capacitors 114.

Figure 3:
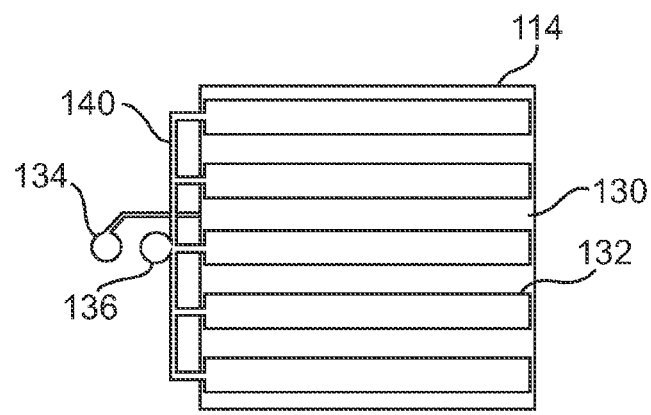
FIG. 3 is a block diagram conceptually illustrating tunable substrate capacitors.

FIG. 3 conceptually illustrates portions of an example of an embodiment of the capacitors 114, which are integrated into the substrate 110. The substrate 110 includes any suitable substrate material such as BT, FR4, etc. In one exemplary embodiment, an area of about 5×5 mm of the entire substrate 110 is used to implement the tunable capacitors 114. The substrate 110 is a laminated structure, including first and second conductive layers 130, 132 that are spaced apart from each other. The conductive layers 130, 132 can be formed from copper, for example. Each of the layers 130, 132 is connected to a respective contact 134, 136.

In the example illustrated in FIG. 3, the first layer 130 is a solid metal plane that may be connected to ground, depending on whether the capacitor is grounded or not. The second layer 132 includes a matrix of conductive strips situated above the first layer 130 such that a certain capacitance is defined based on the area of the conductive strips and the material and distance separating the first and second layers 130, 132.

For the example shown in FIG. 3, each of the strips 132 defines the same area. Thus, if all of the unit capacitors formed by respective strips 132 and the first layer are connected together, the resulting value is approximately five times higher than the value of one of the capacitors. The number and size of the conductive strips 132 can be adapted to the needs of the particular device, such as the main frequency of the RF device. In some embodiments where one of the terminals of the capacitor is grounded, the ground layer of the substrate 110 functions as the first layer 130, thus eliminating the need for an extra conductive layer.

The conductive strips of the second layer 132 are connected to one another and the contact 136 by fusible links 140. By opening selective ones of the links 140, the desired strips of the second layer 132 are disconnected from the contact 136 (and from a device coupled to the contact 132). In this manner, the value of the capacitor 112 can be changed as necessary to tune the antenna 120. As shown in FIG. 3, the second layer 132 is positioned as either the top or bottom layer. This allows access to the fusible links 140, enabling laser fusing and thereby disconnecting selected ones of the strips from the contact 136 to adjust the capacitance. In this manner, "on-the-go" optimization of the antenna matching process during testing is provided, without a need to disconnect or interrupt the test procedure.

Figure 4:
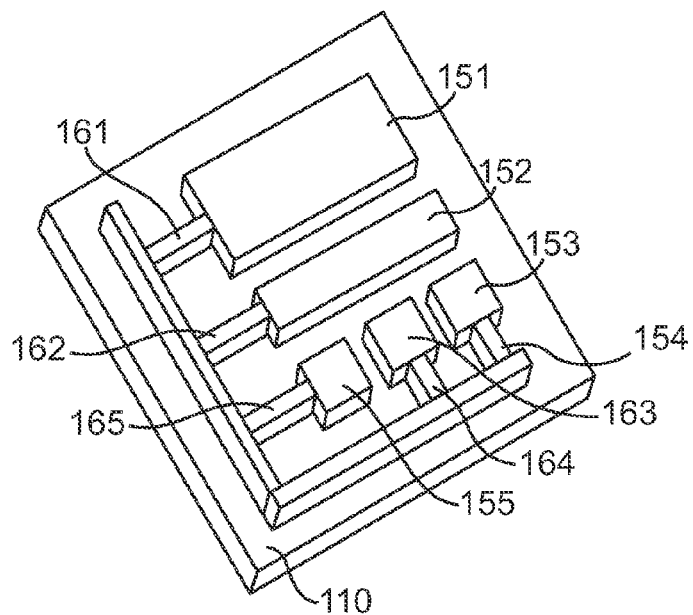
FIG. 4 is a perspective view conceptually illustrating portions of a tunable capacitor including capacitors of different values.

FIG. 4 conceptually illustrates portions of an embodiment of the capacitor 112, where capacitors of different values are used to achieve the desired capacitance value. The capacitor 112 illustrated in FIG. 4 includes five individual capacitors 151, 152, 153, 154, 155 on the substrate 110. The particular arrangement of the capacitors 151-155 illustrated in FIG. 4 is exemplary only—other arrangements are possible and would be a routine undertaking for one skilled in the art having the benefit of this disclosure. Each of the individual capacitors are electrically connected (at least initially) by corresponding fusible links 161, 162, 163, 164, 165. The fusible links 160 are exposed such that a laser is able to break selected connections during a testing process, thereby RF-tuning in embodiments with an RF device and antenna connected to the capacitors.

In the illustrated example, the capacitors 151-155 have three different values, C1, C2 and C3, due to the different sized (different area) of the second layer conductive strips with respect to the first layer conductive plane (which can be the substrate ground layer in embodiments where grounded capacitors are required). Several factors influence the capacitance value of the capacitors 151-155, such as the distance between conductive layers, the dielectric material between the capacitor layers, the size (area) of the conductive strips, etc. With five individual capacitors 151-155 having three different capacitance values C1, C2 and C3 due to their different area with respect to the below lying conductive layer, the following capacitance values are possible.

|    | Fuse 161 | Fuse 162 | Fuse 163 | Fuse 164 | Fuse 165 | Capacitance |
|----|----------|----------|----------|----------|----------|-------------|
| 1  | Open     | Open     | Closed   | Open     | Open     | C3          |
| 2  | Open     | Open     | Closed   | Closed   | Open     | 2 * C3      |
| 3  | Open     | Open     | Closed   | Closed   | Closed   | 3 * C3      |
| 4  | Open     | Closed   | Open     | Open     | Open     | C2          |
| 5  | Open     | Closed   | Closed   | Open     | Open     | C2 + C3     |
| 6  | Open     | Closed   | Closed   | Closed   | Open     | C2 + 2 * C3 |
| 7  | Open     | Closed   | Closed   | Closed   | Closed   | C2 + 3 * C3 |
| 8  | Closed   | Open     | Open     | Open     | Open     | C1          |
| 9  | Closed   | Open     | Closed   | Open     | Open     | C1 + C3     |
| 10 | Closed   | Open     | Closed   | Closed   | Open     | C1 + 2 * C3 |
| 11 | Closed   | Open     | Closed   | Closed   | Closed   | C1 + 3 * C3 |
| 12 | Closed   | Closed   | Open     | Open     | Open     | C1 + C2     |
| 13 | Closed   | Closed   | Closed   | Open     | Open     | C1 + C2 + C3 |
| 14 | Closed   | Closed   | Closed   | Closed   | Open     | C1 + C2 + 2 * C3 |
| 15 | Closed   | Closed   | Closed   | Closed   | Closed   | C1 + C2 + 3 * C3 |

Figure 5:
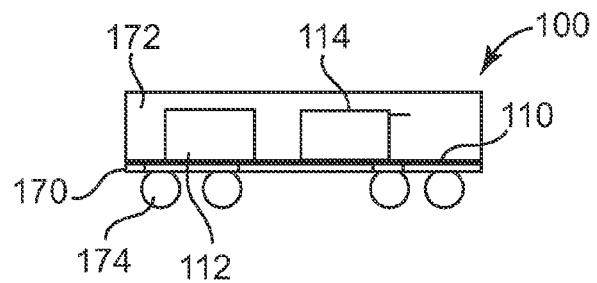
FIG. 5 is a side view of an embodiment of an integrated circuit system.

FIG. 5 illustrates a side view of an embodiment of the integrated circuit device 100, in which an RF device 112 is connected to tunable capacitors 114. The system 100 includes a substrate 110 upon which the RF device 112 and capacitors 114 (such as the capacitors 151-155) are mounted, as well as the fusible links 161-165. As noted above, the fusible links 161-165 are situated such that selected ones can be opened (by a laser, for example) during a testing or tuning process. In the embodiment illustrated in FIG. 5, substrate 110 is a redistribution layer (RDL) 170. Once the desired capacitance value is achieved to tune the device, the device can be encapsulated in a mold compound 172.

In one exemplary embodiment, the system 100 is a wafer level ball grid array (WLB), in which the RF device 112 and the capacitors 114 are embedded in the mold compound 172 and an array of solder balls 174 are attached to contact areas on the underside of the substrate 110. The connections between the RF device 112 and the capacitors 114, and from these devices to the contact areas and thus the solder balls 174 of the device 100 are provided by the RDL 170.

In a process sometimes referred to as "reconfiguration," a plurality of integrated circuit devices, such as the RF device 112 are spaced apart and the gaps between the devices 112 (and other devices situated on the RDL 170) are subsequently filled with the mold material 172. This process provides additional space around the active area of the integrated circuit devices for the fusible links 161-165, among other things. The molding material 172 provides a relatively inexpensive placeholder for bearing additional interconnect elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device, comprising:
   a substrate having contacts;
   a plurality of capacitors on the substrate; and
   a plurality of fusible links selectively connecting the plurality of capacitors to one another and connecting selected ones of the capacitors to the contacts;
   wherein the substrate includes a first conductive layer and a second layer having a plurality of conductive strips spaced apart from the first conductive layer to form the plurality of capacitors.

2. The integrated circuit device of claim 1, further comprising a printed circuit board, the substrate being mounted on the printed circuit board.

3. The integrated circuit device of claim 1, further comprising an antenna connected to the contacts of the substrate.

4. The integrated circuit device of claim 3, further comprising an RF device mounted on the substrate and coupled to the antenna.

5. The integrated circuit device of claim 1, wherein the plurality of capacitors have different capacitance values.

6. The integrated circuit device of claim 1, wherein the first conductive layer is grounded.

7. The integrated circuit device of claim 1, further comprising a mold compound encapsulating the device.

8. A method for producing an integrated circuit device, comprising:
   providing a substrate including a first conductive layer and a second layer spaced apart from the first conductive layer, the second conductive layer including a plurality of conductive strips, wherein a first contact is connected to the first conductive layer and a second contact is connected to the conductive strips by fusible links;
   mounting an integrated circuit on the substrate;

connecting the first and second contacts to the integrated circuit;

testing the integrated circuit;

opening selected ones of the fusible links in response to the testing.

9. The method of claim 8, further comprising mounting the substrate on a printed circuit board after opening selected ones of the fusible links.

10. The method of claim 8, wherein the fusible links are opened using a laser.

11. An RFID device, comprising:
a laminated substrate including a first conductive layer and a second conductive layer spaced apart from the first conductive layer, the second conductive layer including a plurality of conductive strips;
a first contact on the substrate connected to the first conductive layer;
a second contact connected to the conductive strips by fusible links, such that selected ones of the conductive strips are selectively connectable to one another and the second contact by opening desired ones of the fusible links;
an antenna mounted on the substrate and connected to the first and second contacts; and
an RF device mounted on the substrate and connected to the antenna.

12. The RFID device of claim 11, wherein the first conductive layer and the conductive strips form a plurality of capacitors that have different capacitance values.

13. The RFID device of claim 11, wherein the first conductive layer is grounded.

14. The RFID device of claim 11, further comprising a mold compound encapsulating the device.

15. The RFID device of claim 11, wherein the substrate is mounted on a PCB.

* * * * *